US012718136B1

(12) United States Patent
Kim et al.

(10) Patent No.: US 12,718,136 B1
(45) Date of Patent: Aug. 25, 2026

(54) SYSTEM FOR AUTOMATIC PREDICTIVE MODEL TRAINING AND RELEASE

(71) Applicant: Workday, Inc., Pleasanton, CA (US)

(72) Inventors: Yon-Seo Kim, Alameda, CA (US); Parag Avinash Namjoshi, Foster City, CA (US); Joseph Turian, Berlin (DE); Yury Markovsky, San Francisco, CA (US); Lakshminarayanan Renganarayana, Alameda, CA (US)

(73) Assignee: Workday, Inc., Pleasanton, CA (US)

( * ) Notice: Subject to any disclaimer, the term of this patent is extended or adjusted under 35 U.S.C. 154(b) by 1195 days.

(21) Appl. No.: 15/906,874

(22) Filed: Feb. 27, 2018

(51) Int. Cl.
*G06N 20/00* (2019.01)
*G06F 30/20* (2020.01)

(52) U.S. Cl.
CPC ............. *G06N 20/00* (2019.01); *G06F 30/20* (2020.01); *G06F 2216/03* (2013.01)

(58) Field of Classification Search
None
See application file for complete search history.

(56) References Cited

U.S. PATENT DOCUMENTS 6,973,459 B1 * 12/2005 Yarmus ............. G06F 16/24544 707/999.102
7,428,514 B2 9/2008 Jin
7,444,310 B2 10/2008 Meng
8,027,938 B1 9/2011 Xu
9,195,671 B2 * 11/2015 Murthy .............. G06Q 30/0201
10,423,403 B1 * 9/2019 Natarajan ................ G06F 8/65
10,699,404 B1 6/2020 Nussbaum
11,043,026 B1 6/2021 Fathi
2002/0083067 A1 * 6/2002 Tamayo ................ G06F 16/951
2011/0055127 A1 3/2011 Umblijs
2011/0213757 A1 9/2011 Bhaskaran
2012/0170834 A1 7/2012 Wang
2014/0164059 A1 * 6/2014 Dove ........................ G06N 5/01 705/7.31
2014/0279754 A1 * 9/2014 Barsoum ................ G06N 20/00 706/12
2015/0109443 A1 4/2015 Nichols
2015/0134413 A1 * 5/2015 Deshpande ........ G06Q 30/0205 705/7.31
2015/0193697 A1 * 7/2015 Vasseur ............... H04L 43/0876 706/12
2015/0339572 A1 * 11/2015 Achin .................. G06F 9/5011 706/46
2016/0180264 A1 * 6/2016 Beck .................. G06Q 10/0635 705/7.28
2016/0180291 A1 * 6/2016 Beck .................. G06Q 10/1053 705/7.28

(Continued)

*Primary Examiner* — Henry Orr
(74) *Attorney, Agent, or Firm* — Cooper Legal Group, LLC

(57) ABSTRACT

A system for automatic model training and release includes a model storage system, an interface, and a processor. The interface is configured to receive an indication to create a model for release. The processor is configured to fetch data for creation of the model; validate the data to determine a data validation result; extract features based at least on part the data; validate the features using one or more feature quality metrics; build the model based at least in part on the features and the data; validate the model using one or more model quality metrics; store the model using the model storage system; and release the model for use.

20 Claims, 12 Drawing Sheets

(56) References Cited

U.S. PATENT DOCUMENTS

2017/0004414 A1 1/2017 Flores
2017/0091622 A1* 3/2017 Taylor .................... G06F 17/18
2017/0124487 A1* 5/2017 Szeto ................. G06F 11/1448
2017/0193545 A1 7/2017 Zhou
2017/0372232 A1 12/2017 Maughan
2018/0024271 A1 1/2018 Koch
2018/0024859 A1 1/2018 Doshi
2018/0032038 A1* 2/2018 Kang .................. G05B 13/026
2018/0046926 A1* 2/2018 Achin .................... G06Q 10/04
2018/0096028 A1* 4/2018 Masekera ........... G06F 16/2462
2018/0124146 A1 5/2018 Chen
2018/0146612 A1 5/2018 Sauder
2018/0189826 A1 7/2018 Xu
2018/0211373 A1* 7/2018 Stoppa ..................... G06T 7/55
2018/0293511 A1* 10/2018 Bouillet ................. G06N 5/022
2019/0087239 A1* 3/2019 Adibowo ............... G06N 20/20
2019/0129712 A1* 5/2019 Hawrylo .................. G06F 8/20
2019/0130303 A1 5/2019 Bigaj
2019/0235846 A1 8/2019 Janjua
2020/0019493 A1 1/2020 Ramakrishna
2020/0186227 A1 6/2020 Reider

* cited by examiner

SYSTEM FOR AUTOMATIC PREDICTIVE MODEL TRAINING AND RELEASE

BACKGROUND OF THE INVENTION

Computing systems commonly collect user data and analyze the user data to predict user needs and serve users better. For example, a movie recommendations website collects data describing user movie preferences and uses the data to build a model that is able to predict movies it believes the users will like. Construction of predictive models in this way is typically done by data scientists examining the data closely, deciding the model family, verifying assumptions, tuning model hyper-parameters, and assessing model quality to create an accurate model. Manual tuning requires the data scientists to work closely with the data, creating a problem where in the event that the data scientist is not able to access the data (e.g., because the data is private) tuning cannot be performed. Additionally, in the event a large number of models need to be created, manual model building and verification is economically infeasible. For software as a service systems, both problems can be present, wherein the software as a service provider desires to create one or more models for each of a large number of customers, wherein each model performs a prediction based on private customer data.

BRIEF DESCRIPTION OF THE DRAWINGS

Various embodiments of the invention are disclosed in the following detailed description and the accompanying drawings.

DETAILED DESCRIPTION

Figure 1:
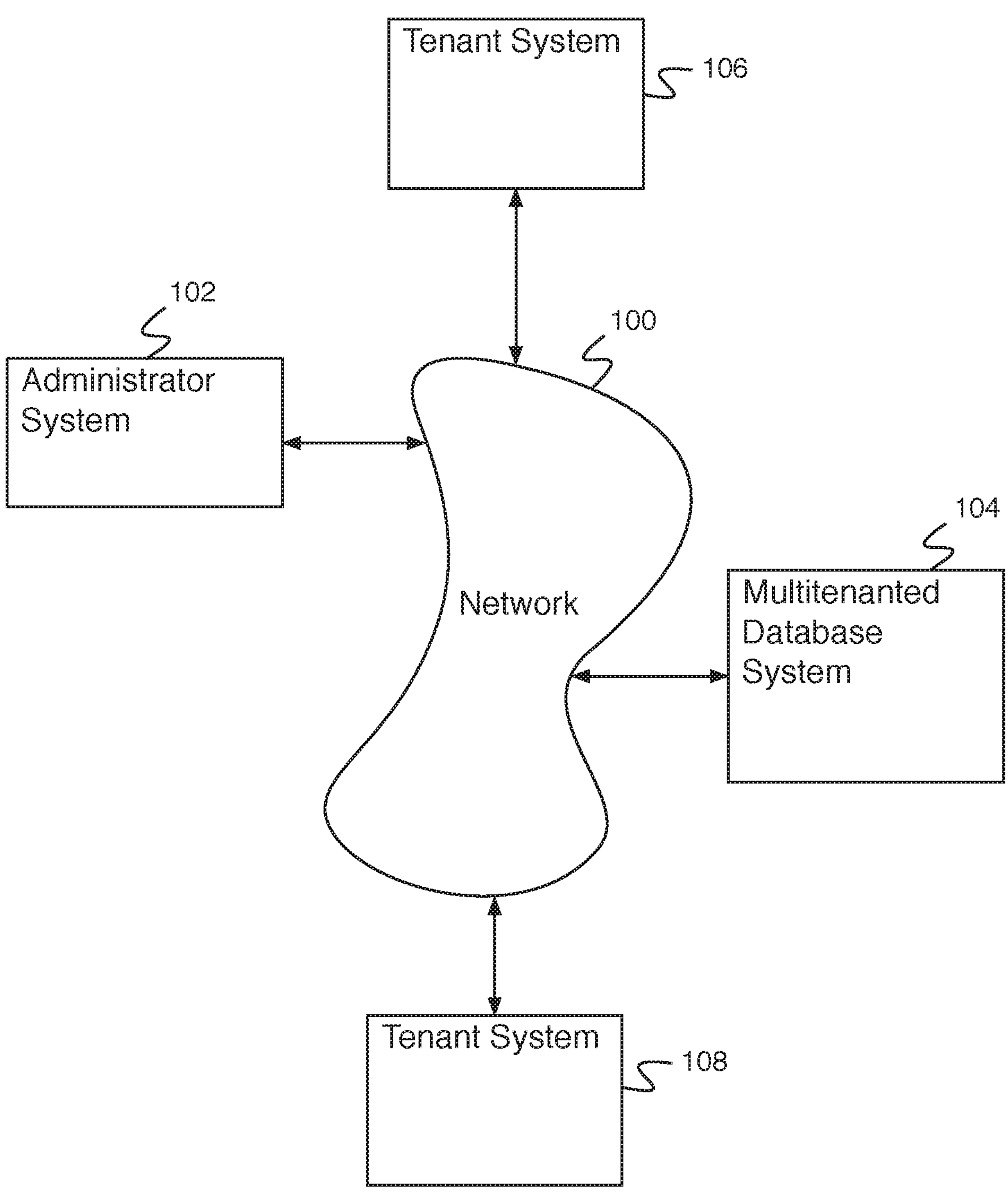
FIG. 1 is a block diagram illustrating an embodiment of a network system.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A system for automatic model training and release comprises a model storage system, and an interface configured to receive an indication to create a model for release. The system for automatic training and model release additionally comprises a processor configured to fetch data for creation of the model, validate the data to determine a data validation result, extract features based at least in part on the data, validate the features using one or more feature quality metrics, build the model based at least in part on the features and the data, validate the model using one or more model quality metrics, store the model using the model storage system, and release the model for use. The system for automatic model training and release additionally comprises a memory coupled to the processor and configured to provide the processor with instructions.

A system for automatic model release comprises a model release system for automatically validating training data, building (including training using the training data), verifying, and releasing a model (for example, a machine learning model, a neural network, etc.) based on data. The system for automatic model release comprises a system stored on a tenant area of a multitenanted server system. For example, the multitenanted server system comprises a plurality of tenanted areas, each tenanted area associated with a tenant (e.g., a customer). Tenanted areas of the multitenanted server system store tenanted data, comprising private data associated with a customer that can only be accessed by the customer (e.g., not by other customers nor by a system administrator or other users not associated with the customer). Each tenanted area of the multitenanted server system comprises an instance of the system for automatic model release. The system for automatic model release automatically builds models including training the model based on tenanted data. The system for automatic model release receives an indication to create a model for release—for example, from a user associated with a tenant, from an administrator associated with a tenant, etc. In some embodiments, the administrator may indicate periodic creation and release of a model. In some embodiments, the indication to create a model for release comprises an indication of a specific model type. The system for automatic model release then fetches data for creation of the model. Data is retrieved from the tenanted data storage. Data is associated with the tenant, with users affiliated with the tenant, with customers of the tenant, etc. The system for automatic model release first validates the data to determine a data validation result and to ensure that data meets modelling assumptions. Validating the data is necessary to determine whether a good enough quality model can be built from the data. The system for automatic model release then extracts features from the data and validates the features. Features comprise model input and are typically functions of the data. In the event the features are determined to fall below a specific quality threshold, it is determined that building a model based on the features is not possible and the model building process is abandoned. In the event the features and data are good enough quality, the model is built and stored in a model storage system. The model storage system is additionally part of the tenanted area of the multitenanted server system, and the built model comprises tenanted data (e.g., private data that is not able to be viewed by a user not associated with the tenant). The model is validated using out-of-sample or holdout data and other goodness-of-fit metrics and in the event it passes a model quality threshold it is released for use. The three automatic validation steps ensure that the built model will be of sufficient quality to provide useful predictive assistance to the customer.

The system for automatic model release improves the computing system by enabling the creation of models based on private tenanted data without violating the prohibition of sharing the tenanted data with a system administrator not associated with the tenant. In the event a multitenanted server system comprises a large plurality of tenants (e.g., hundreds of tenants, thousands of tenants, etc.), the system for automatic model release can be used to build custom tenanted models for each tenant. In addition, typical conventional systems are improved as no automation for model release is available and the automatic model release system enables faster and more efficient computer system as model building and verification are faster, economically viable (e.g., not expensive), and require less labor (e.g., data scientist hours). The automatic model release system also enables customized models for each tenant based on tenant data also creating better computer systems as they are appropriately tailored for a tenant and for a tenant's data.

FIG. 1 is a block diagram illustrating an embodiment of a network system. In some embodiments, the network system of FIG. 1 comprises a network system for a system for automatic model release. In the example shown, tenant system 106 and tenant system 108 store data on separate tenanted areas of multitenanted database system 104. Multitenanted database system 104 comprises a plurality of tenanted areas, each associated with a tenant comprising one or more tenant systems. Data stored in a tenanted area is only accessible to users and systems associated with the tenant and is not accessible to users or systems associated with other tenants or to administrators associated with multitenanted database system 104 (e.g., administrators accessing multitenanted database system 104 via administrator system 102). Administrator system 102 is able to administrate different components of the system including multitenanted database system 104.

In the example shown, FIG. 1 comprises network 100. In various embodiments, network 100 comprises one or more of the following: a local area network, a wide area network, a wired network, a wireless network, the Internet, an intranet, a storage area network, or any other appropriate communication network. Administrator system 102, multitenanted database system 104, tenant system 106, and tenant system 108 communicate via network 100. Administrator system 102 comprises an administrator system for use by an administrator. Administrator system 102 comprises an administrator system for executing administrator commands, for configuring multitenanted database system 104, etc. Multitenanted database system 104 comprises a database system for providing tenant user access to data stored in a tenanted area of multitenanted database system 104 (e.g., access to add data, view data, modify data, delete data, access reports, execute business processes, etc.). Tenant system 106 and tenant system 108 comprise tenant systems for use by tenant users. A tenant user uses a tenant system to interact with multitenanted database system 104, for example to store database data, to request database data, to request reporting based on database data, to request creation of a model based on database data, to use a model based on database data, etc. In some embodiments, the network system of FIG. 1 comprises a plurality of tenant systems associated with one or more tenants.

A tenant user uses a tenant system to provide an indication to multitenanted database system 104 to create a model for release. For example, the tenant user uses the tenanted system to provide the indication to create a model for release to a model release system of a tenanted system of multitenanted database system 104. A model release system of multitenanted database system 104 receives the indication, fetches data for creation of the model, and validates the data using one or more data quality metrics. In the event that validating the data indicates that the data is good enough, the model release system extracts features based at least in part on the data and validates the features using one or more feature quality metrics. In the event that validating the features indicates that the features are good enough, the model release system builds the model based at least in part on the features and the data including training the model, stores the model using a model storage system, and validates the model using one or more model quality metrics. In the event that validating the model indicates that the model is good enough, the model release system releases the model for use. In various embodiments, the model is created once, on demand, periodically, or with any other appropriate timing.

Figure 2:
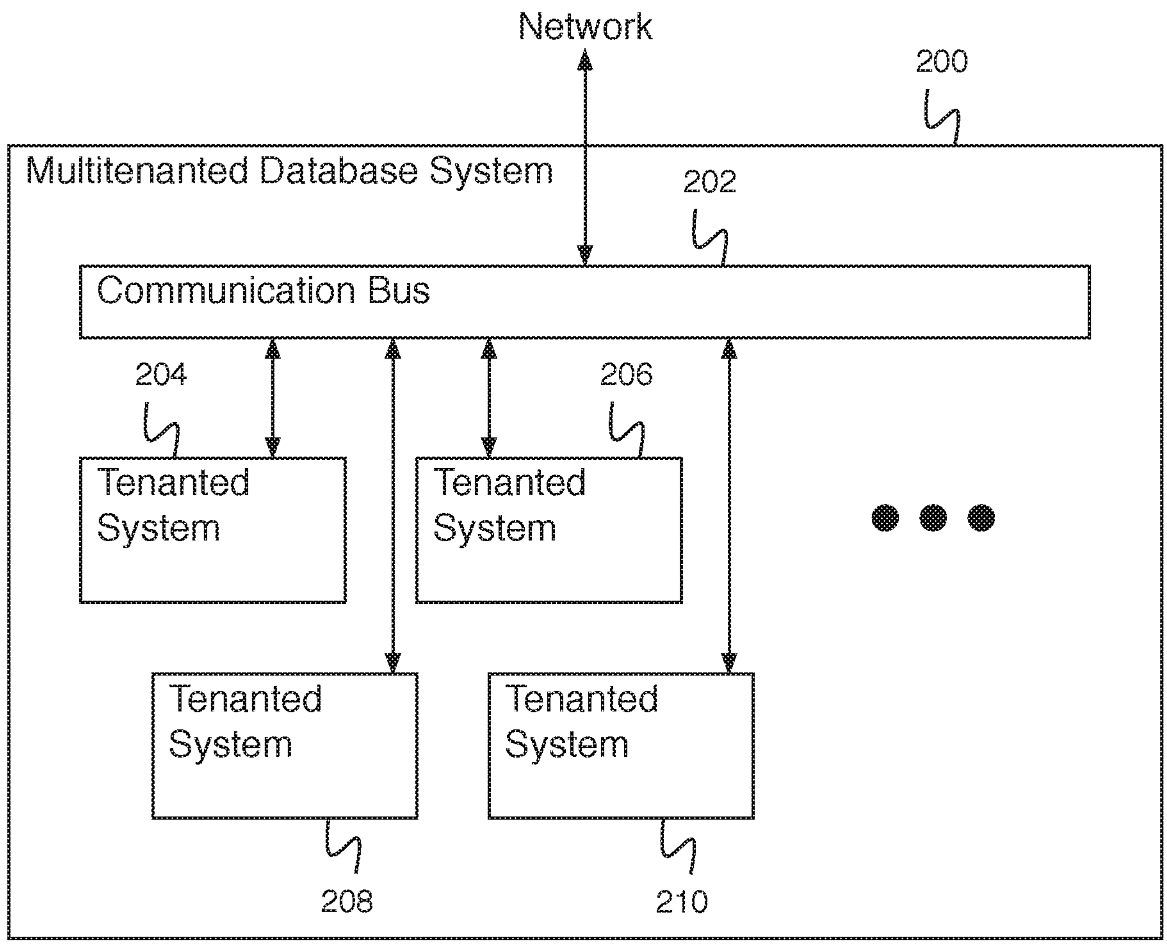
FIG. 2 is a block diagram illustrating an embodiment of a multitenanted database system.

FIG. 2 is a block diagram illustrating an embodiment of a multitenanted database system. In some embodiments, multitenanted database system 200 comprises multitenanted database system 104 of FIG. 1. In the example shown, multitenanted database system 200 comprises communication bus 202 and a plurality of tenanted systems (e.g., tenanted system 204, tenanted system 206, tenanted system 208, and tenanted system 210). Multitenanted database system comprises any appropriate number of tenanted systems (e.g., 1 tenanted system, 2 tenanted systems, 12 tenanted systems, 122 tenanted systems, 1543 tenanted systems, etc.). Communication bus 202 comprises a communication bus for allowing each of the tenanted systems to communicate with a network (e.g., with network 100 of FIG. 1). In some embodiments, communication bus 202 does not allow tenanted systems of multitenanted database system 200 to communicate with each other. Each tenanted system of multitenanted database system 200 comprises a system for automatic model release for building tenanted models based on tenanted data.

Multitenanted database system 200 receives an indication (e.g., from a tenant user using a tenant system) to create a model for release. For example, the indication to create a model for release is associated with a tenanted system of the plurality of tenanted systems. Communication bus 202 provides the indication to the appropriate tenanted system of the plurality of tenanted systems. A model release system of the appropriate tenanted system receives the indication, fetches data for creation of the model, and validates the data using one or more data quality metrics. In the event that validating the data indicates that the data is good enough, the model release system extracts features based at least in part on the data and validates the features using one or more feature quality metrics. In the event that validating the features indicates that the features are good enough, the model release system builds the model based at least in part on the features and the data including training the model, stores the model using a model storage system, and validates the model using one or more model quality metrics. In the event that validating the model indicates that the model is good enough, the model release system releases the model for use.

Figure 3:
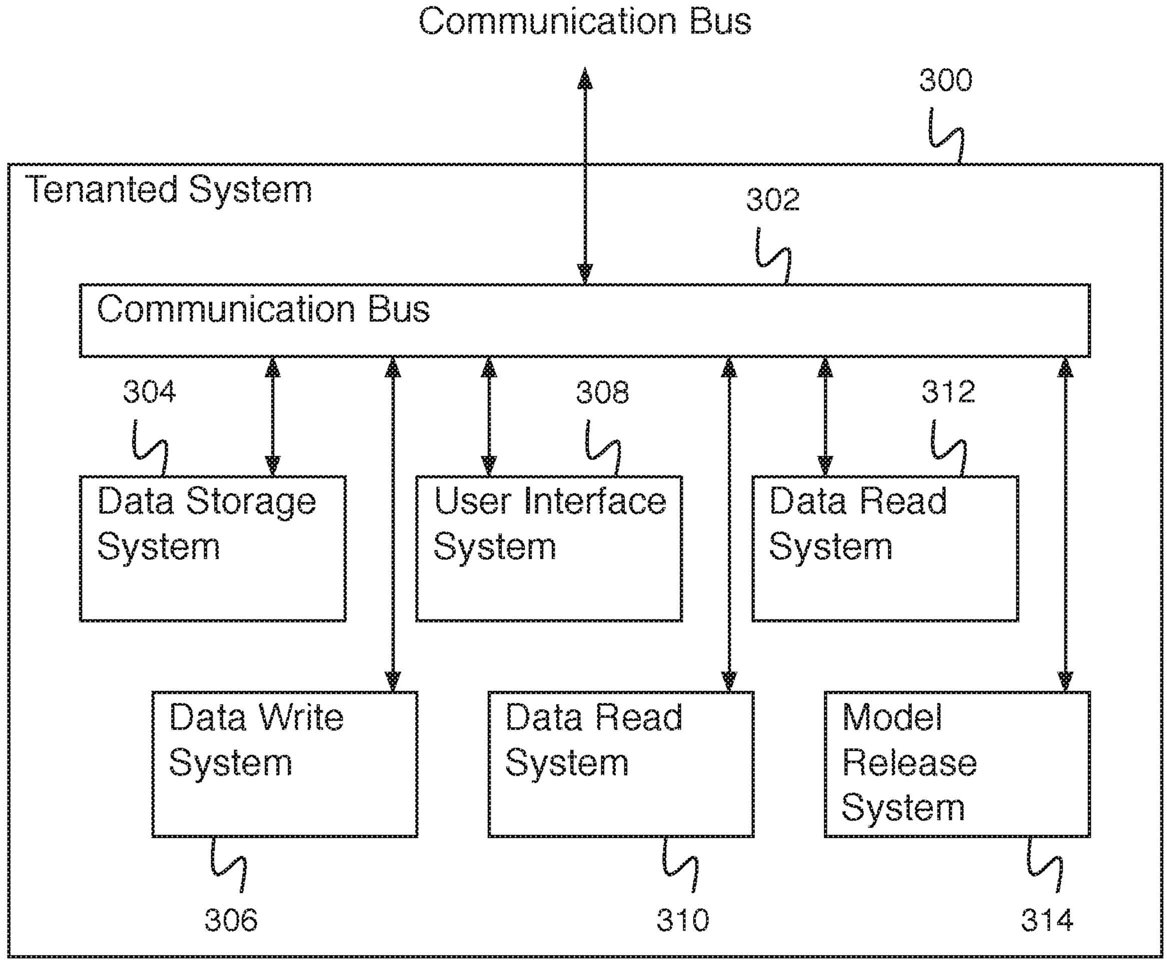
FIG. 3 is a block diagram illustrating an embodiment of a tenanted system.

FIG. 3 is a block diagram illustrating an embodiment of a tenanted system. In some embodiments, tenanted system 300 of FIG. 3 comprises a tenanted system of FIG. 2 (e.g., tenanted system 204 of FIG. 2). In the example shown, tenanted system 300 comprises communication bus 302, data storage system 304, data write system 306, user interface system 308, data read system 310, data read system 312, and model release system 314, Communication bus 302 comprises a communication bus for allowing each of the other systems of tenanted system 300 to communicate with an external communication bus (e.g., communication bus 202 of FIG. 2, e.g., for communicating with a network system) and to communicate with each other. Data storage system 304 comprises a data storage system for storing tenant data. Data write system 306 comprises a system for performing write operations on tenant data stored by data storage system 304. For example, a write operation comprises a write lock operation, a data write operation, a data verify operation, and an unlock operation. A write lock operation locks the data storage system to prevent any other read or write operations from occurring while the write lock is in place. User interface system 308 comprises a user interface system for providing a user interface to a user (e.g., a user interface for reading data, writing data, executing applications, executing reporting, requesting a model, using a model, etc.). Data read system 310 and data read system 312 comprise systems for performing read operations on tenant data stored by data storage system 304. For example, a read operation comprises a read lock operation, a data read operation, and an unlock operation. A read lock operation locks the data storage system to prevent write operations from occurring while the read lock is in place. Multiple read operations can occur simultaneously. Tenanted system 300 comprises any appropriate number of data read systems (e.g., 1 data read system, 4 data read systems, 11 data read systems, etc.). Model release system 314 comprises a system for automatically building and releasing a model. Model release system 314 receives an indication from a user to build a model (e.g., via communication bus 302) and builds the model based at least in part on data stored in data storage system 304 by training the model using training data. Model release system 314 additionally receives an indication from a user to execute a stored model, executes the stored model, and provides model results to the user.

Tenanted system 300 receives an indication to create a model for release. For example, the indication to create a model for release is received from a tenant user using a tenant system. Communication bus 302 receives the indication and provides it to model release system 314. Model release system 314 receives the indication, fetches data for creation of the model, and validates the data using one or more data quality metrics. In the event that validating the data indicates that the data is good enough, model release system 314 extracts features based at least in part on the data and validates the features using one or more feature quality metrics. In the event that validating the features indicates that the features are good enough, model release system 314 builds the model based at least in part on the features and the data, stores the model using a model storage system, and validates the model using one or more model quality metrics. In the event that validating the model indicates that the model is good enough, model release system 314 releases the model for use.

In the example shown, tenanted system 300 comprises one of a plurality of tenanted systems of a multitenanted database system (e.g., multitenanted database system 200 of FIG. 2). Each tenanted system of the plurality of tenanted systems comprises a model release system (e.g., model release system 314). In some embodiments, the multitenanted database system comprises a model release system in communication with each tenant system of the plurality of tenant systems. The model release system in communication with each tenant system of the plurality of tenant systems receives indications to create a model for release associated with each of the plurality of tenant systems and stores information (e.g., data, data quality metrics, features, feature quality metrics, models, model quality metrics, etc.) in tenant-isolated partitions of a model storage system.

Figure 4:
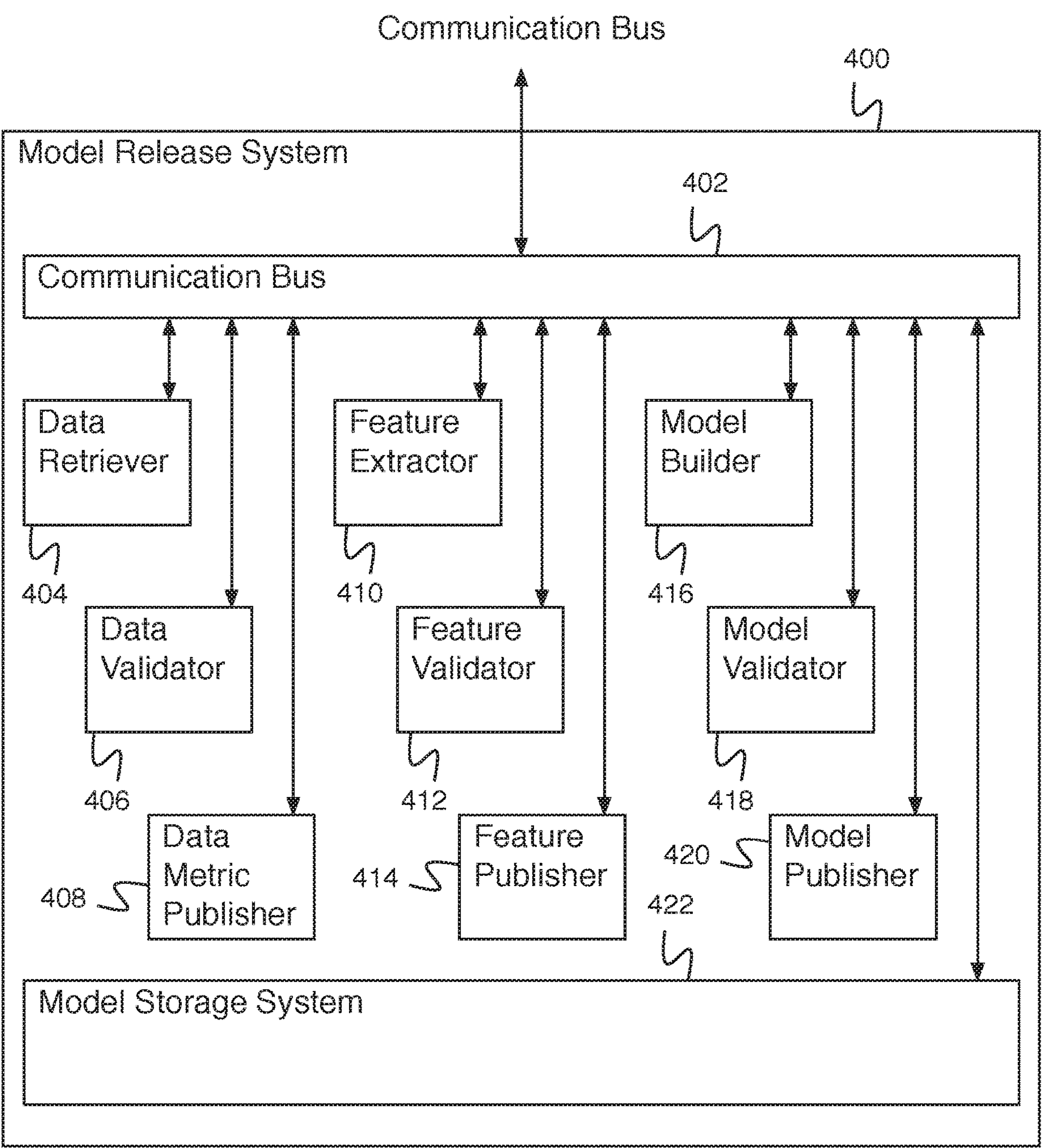
FIG. 4 is a block diagram illustrating an embodiment of a model release system.

FIG. 4 is a block diagram illustrating an embodiment of a model release system. In some embodiments, model release system 400 comprises model release system 314 of FIG. 3. In the example shown, model release system 400 comprises communication bus 402 for allowing the systems of model release system 400 to communicate with each other and with an external communication bus (e.g., communication bus 302 of FIG. 3). Data retriever 404 comprises a data retriever for retrieving data from a data storage (e.g., a data storage system of a tenanted system). Retrieved data is stored in model storage system 422. Retrieved data is used for building and validating a model. Data retriever 404 provides retrieved data to data validator 406 and feature extractor 416. Data validator 406 validates the data using one or more data quality metrics. Results from the data validation are provided to data metric publisher 408. Data metric publisher 408 publishes the data metrics by storing them to model storage system 422. Data metric publisher 408 sorts the data metrics, filters the data metrics, rounds the data metrics, packages the data metrics, selects appropriate data metrics, or prepares the data metrics for publishing in any other appropriate way. Results from the data validation are additionally provided to feature extractor 410 and model builder 416. In some embodiments, data validation results affect a decision of features to extract or a decision of a model to build. Feature extractor 410 extracts features from data. Extracting features comprises computing functions of data. Features are extracted based on a feature extraction template, a feature extraction algorithm, feature extraction functions, etc. Extracted features are provided to feature validator 412 for validation. Feature validator 412 validates features based at least in part on one or more feature quality metrics. Feature quality metrics are provided to feature publisher 414 for publishing (e.g., for storage in model storage system 422). Features determined by feature extractor 410 are additionally provided to model builder 416. Model builder 416 builds the model using the features and data retrieved by data retriever 404. The model is then validated by model validator 418 using additional data retrieved by data retriever 404. In the event the model is determined to be good enough, the model is published by model publisher 420. Publishing the model comprises storing it in model storage system 422, providing it for access via a user interface system, etc. Storing a model in model storage 422 comprises storing the model privately for a tenant.

Figure 5:
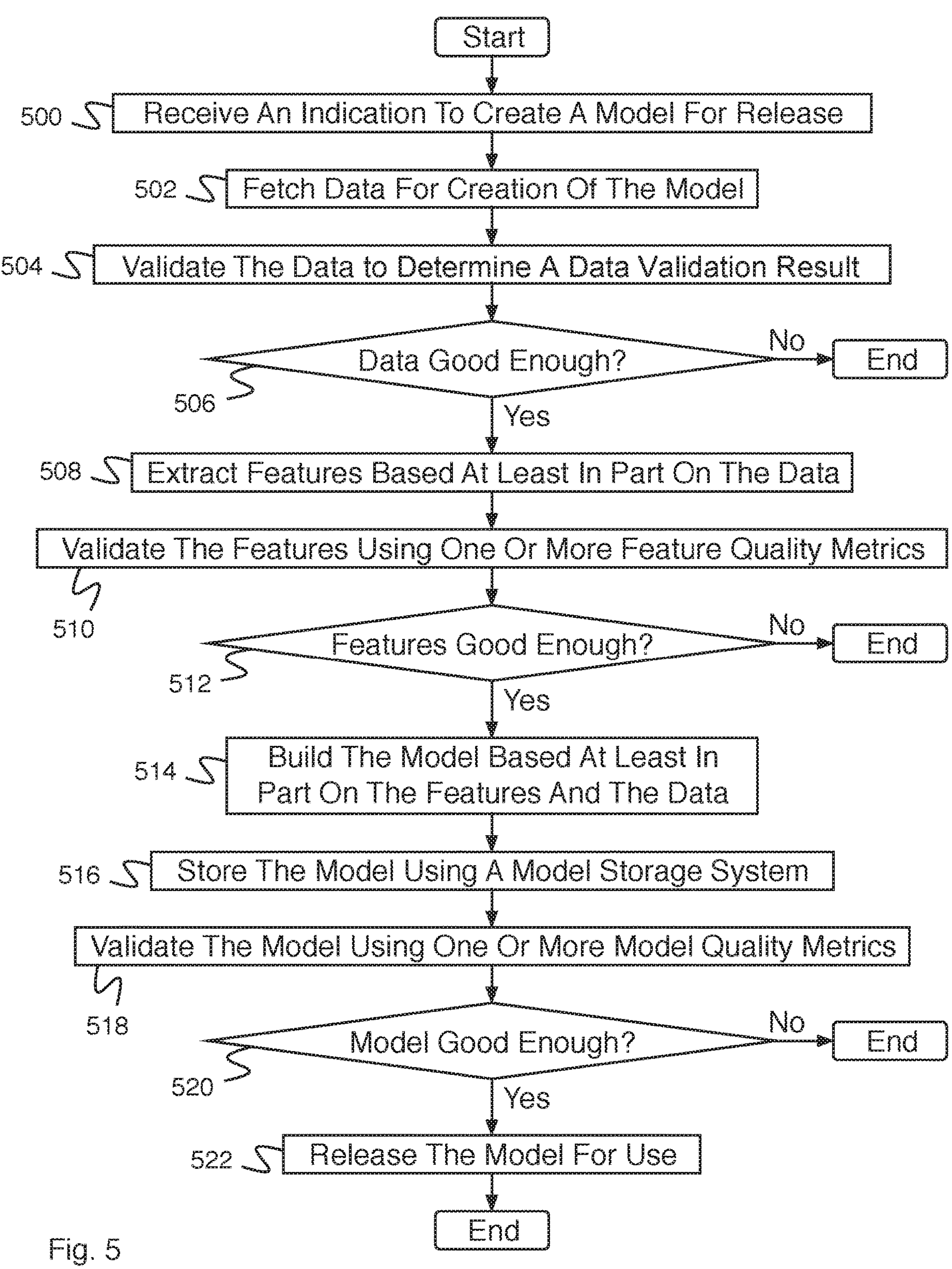
FIG. 5 is a flow diagram illustrating an embodiment for a process for a model release system.

FIG. 5 is a flow diagram illustrating an embodiment for a process for a model release system. In some embodiments, the process of FIG. 5 is executed by model release system 400 of FIG. 4. In the example shown, in 500, an indication to create a model for release is received. For example, the indication comprises a model type of a set of one or more model types. In 502, data is fetched for creation of the model. In 504, the data is validated to determine a data validation result. For example, validating the data comprises determining that validating the data was successful, determining that validating the data failed, or determining a data validation score. For example, the data quality metrics are stored associated with the model or stored linked to the model (e.g., via a symbolic link, a pointer, an indication that the metrics are linked to the model, etc.). In 506, it is determined whether the data is good enough (e.g., whether the data validation score is above a threshold). In the event it is determined that the data is not good enough, the process ends. In the event it is determined that the data is good enough, control passes to 508. In 508, features are extracted based at least in part on the data. In 510, the features are validated using one or more feature quality metrics. For example, the feature quality metrics are stored associated with the model or stored linked to the model (e.g., via a symbolic link, a pointer, an indication that the metrics are linked to the model, etc.). In 512, it is determined whether the features are good enough (e.g., whether the feature quality metrics indicate that the features will be able to create a good quality model). In the event it is determined that the features are not good enough, the process ends. In the event it is determined that the features are good enough, control passes to 514. In 514, the model is built based at least in part on the features and the data. For example, the model is built using a first portion of the data. For example, the model is built using a selected model type of a set of one or more model types. In some embodiments, the selected model type of the set of one or more model types is based at least in part on the data or on the data quality metrics. In 516, the model is stored using a model storage system. In 518, the model is validated using one or more model quality metrics. For example, the model is validated by running the model on a second portion of the data and comparing the model output to a third portion of the data. For example, the model quality metrics are stored associated with the model (e.g., stored using the model storage system) or stored linked to the model (e.g., via a symbolic link, a pointer, an indication that the metrics are linked to the model, etc.). In 520, it is determined whether the model is good enough (e.g., whether the model quality metrics indicate that the model is good enough). In the event it is determined that the model is not good enough, the process ends. In the event it is determined that the model is good enough, control passes to 522. In 522, the model is released for use.

Figure 6:
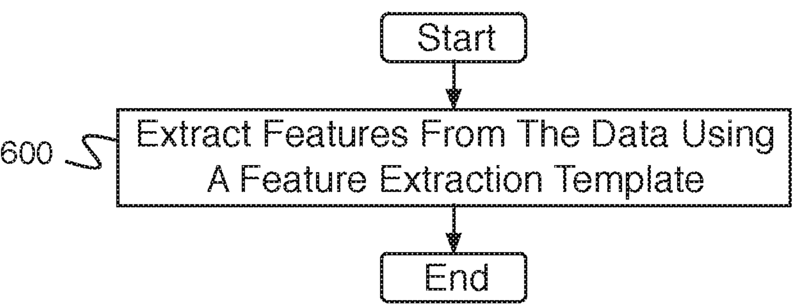
FIG. 6 is a flow diagram illustrating an embodiment of a process for extracting features based at least in part on data.

FIG. 6 is a flow diagram illustrating an embodiment of a process for extracting features based at least in part on data. In some embodiments, the process of FIG. 6 implements 508 of FIG. 5. In the example shown, in 600, features are extracted from the data using a feature extraction template. For example, a feature extraction template comprises one or more algorithms for extracting one or more features from data.

Figure 7:
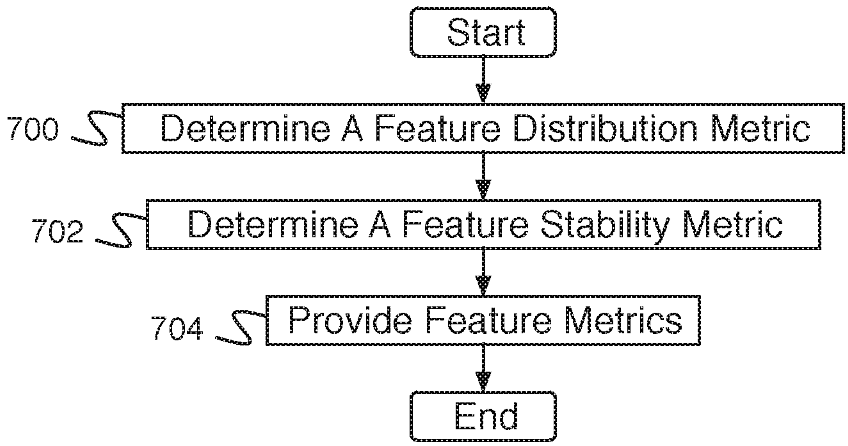
FIG. 7 is a flow diagram illustrating an embodiment of a process for validating features using one or more feature quality metrics.

FIG. 7 is a flow diagram illustrating an embodiment of a process for validating features using one or more feature quality metrics. In some embodiments, the process of FIG. 7 implements 510 of FIG. 5. In the example shown, in 700, a feature distribution metric is determined. For example, a feature distribution metric comprises a determination of whether a statistical distribution of a feature comprises an expected statistical distribution. In some embodiments, determining a feature distribution metric comprises applying a transformation to the feature and determining whether the transformed feature has a normal statistical distribution. In 702 a feature stability metric is determined. For example, a feature stability metric comprises a determination of whether feature statistics at a first time period and feature statistics at a second time period are substantially similar. In 704, feature metrics are provided. In some embodiments, the feature metrics are stored (e.g., using the model storage system). In some embodiments, in the event that feature metrics indicate that a feature is below a threshold feature quality, the feature is dropped (e.g., not used).

Figure 8:
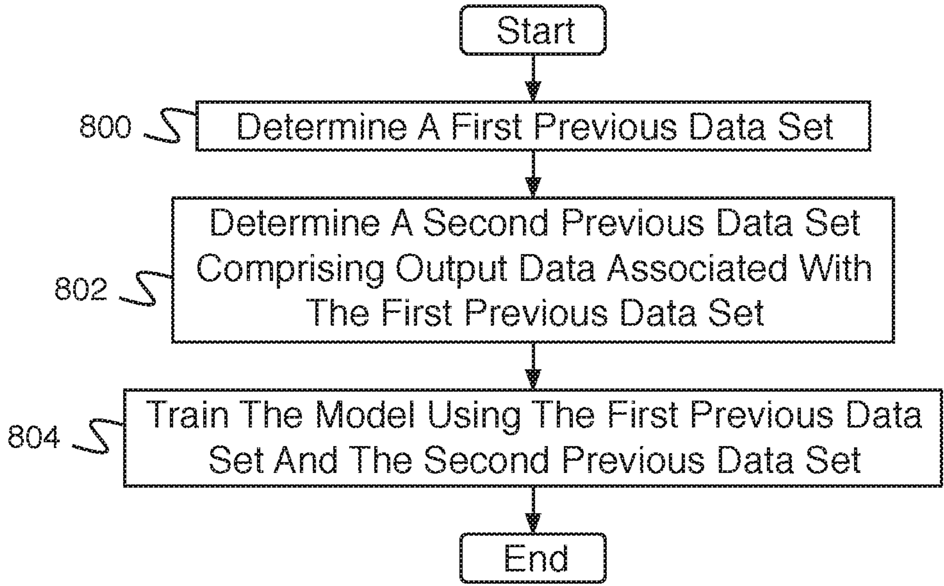
FIG. 8 is a flow diagram illustrating an embodiment of a process for building a model.

FIG. 8 is a flow diagram illustrating an embodiment of a process for building a model. In some embodiments, the process of FIG. 8 implements 514 of FIG. 5. In the example shown, in 800, a first previous data set is determined. For example, a first previous data set and associated features are determined. In 802, a second previous data set comprising output data associated with the first previous data set is determined. In 804, the model is trained using the first previous data set and the second previous data set. In various embodiments, the model comprises a machine learning model, a supervised learning model, an unsupervised learning model, semi-supervised learning model, time series model, a reinforcement learning model, a support vector machine, a neural network, etc.

Figure 9:
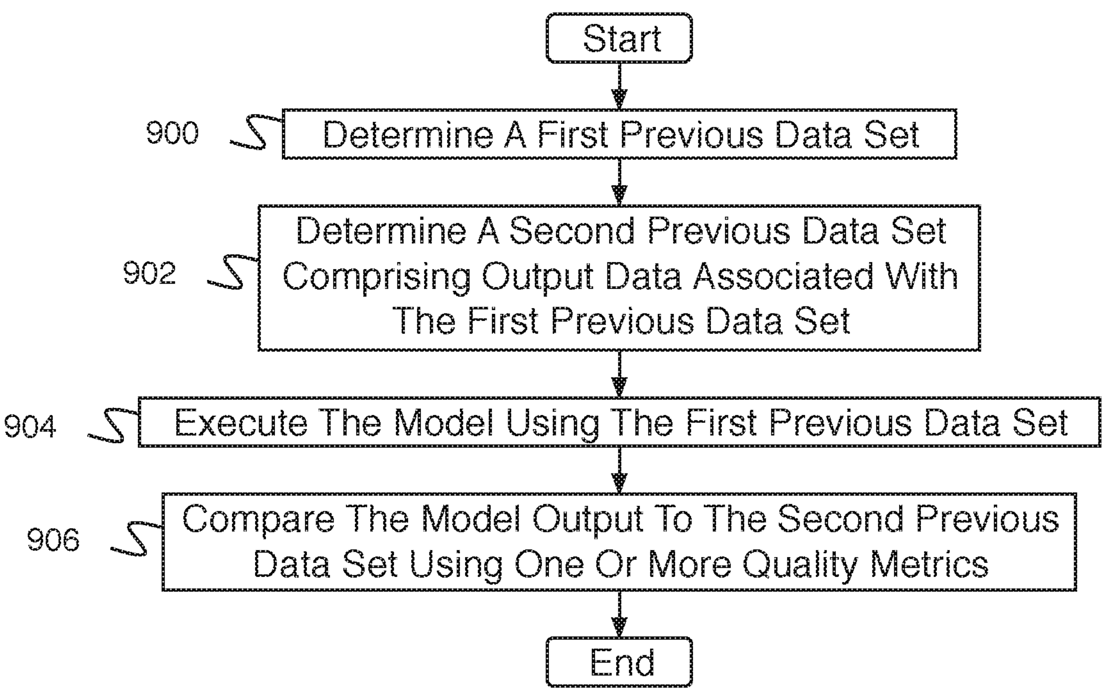
FIG. 9 is a flow diagram illustrating an embodiment of a process for validating a model using one or more quality metrics.

FIG. 9 is a flow diagram illustrating an embodiment of a process for validating a model using one or more quality metrics. In some embodiments, the process of FIG. 9 implements 518 of FIG. 5. In the example shown, in 900, a first previous data set is determined. For example, a different first previous data set is determined than the first previous data set of 800 of FIG. 9. For example, a first previous data set and associated features are determined. In 902, a second previous data set comprising output data associated with the first previous data set is determined. For example, a different second previous data is determined that the second previous data set of 802 of FIG. 8. In 904, the model is executed using the first previous data set. For example, the first previous data set is used as input to the model. In 906, the model output is compared to the second previous data set using one or more quality metrics.

Figure 10:
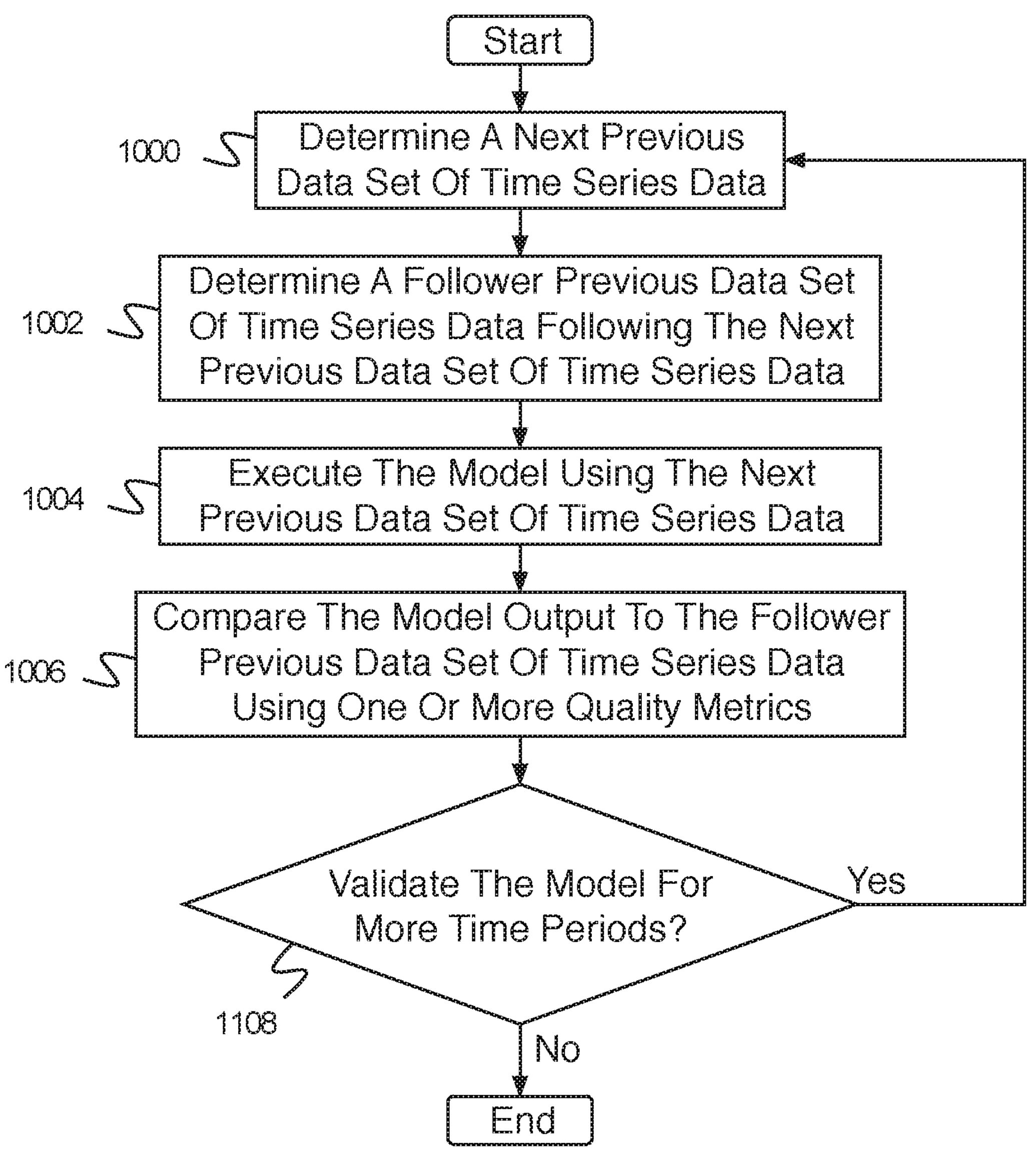
FIG. 10 is a flow diagram illustrating an embodiment of a process for validating a model using one or more quality metrics.

FIG. 10 is a flow diagram illustrating an embodiment of a process for validating a model using one or more quality metrics. In some embodiments, the process of FIG. 10 implements 518 of FIG. 5 for time series data. In 1000, a next previous data set of time series data is determined. For example, the next previous data set of time series data comprises a first previous data set of time series data. For example, a next previous data set of time series data and associated features are determined. In 1002, a follower previous data set of time series data following the next previous data set of time series data is determined. In 1004, the model is executed using the next previous data set of time series data. In 1006, the model output is compared to the follower previous data set of time series data using one or more quality metrics. In 1008, it is determined whether to validate the model for more time periods. In the event it is determined to validate the model for more time periods, control passes to 1000. In the event it is determined not to validate the model for more time periods, the process ends.

Figure 11:
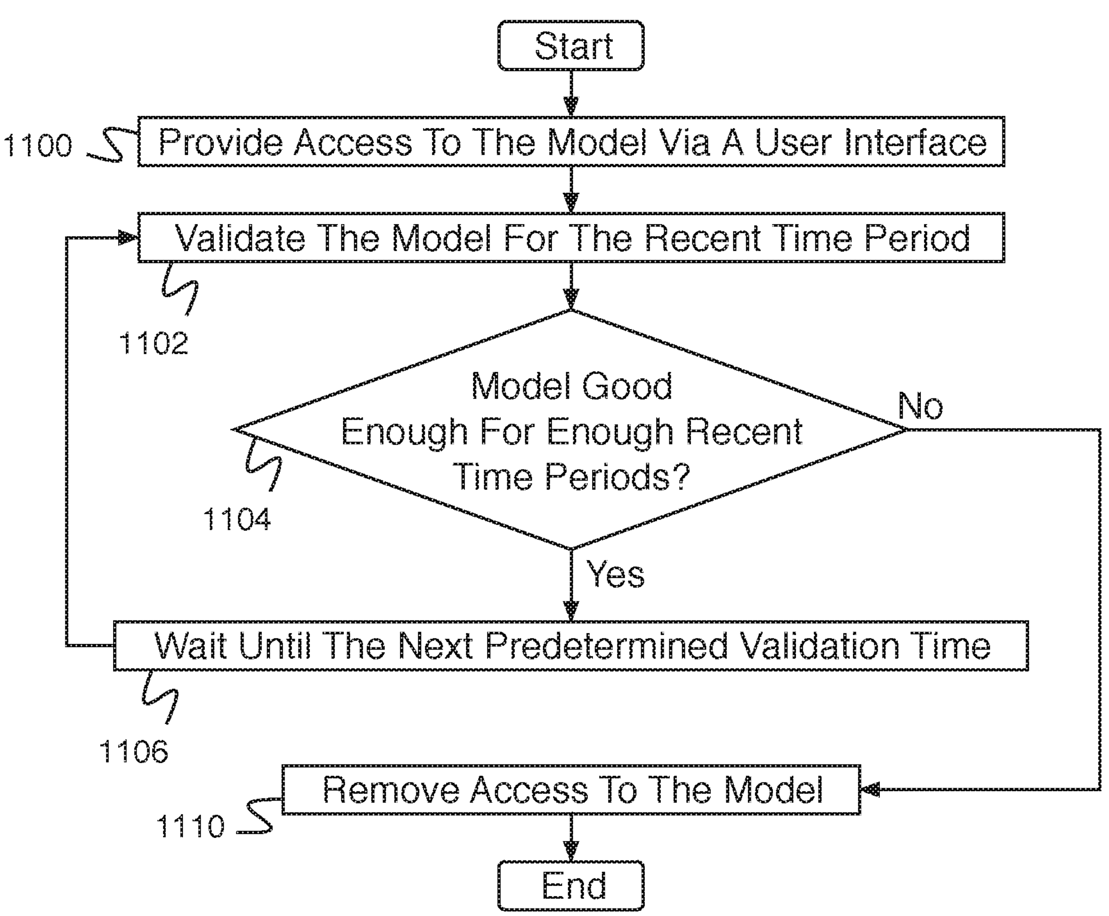
FIG. 11 is a flow diagram illustrating an embodiment of a process for releasing a model for use.

FIG. 11 is a flow diagram illustrating an embodiment of a process for releasing a model for use. In some embodiments, the process of FIG. 11 implements 522 of FIG. 5. In the example shown, in 1100, access is provided to the model via a user interface. For example, the model is added to a list of accessible models in a model user interface. In 1102, the model is validated for the recent time period. For example, the model is validated using the process of FIG. 9 or the process of FIG. 10. In 1104, it is determined whether the model is good enough for enough recent time periods. For example, once access to the model has been provided, access to the model is not removed until the model fails validation a specific number of times, e.g., more than once every six months. In the event it is determined that the model is good enough for enough recent time periods, control passes to 1106. In 1106, the process waits until the next predetermined validation time. For example, the process validates the model every day, once a week, once a month, etc. Control then passes to 1102. In the event it is determined in 1104 that the model is not good enough for enough recent time periods, control passes to 1110. In 1110, access to the model is removed.

Figure 12:
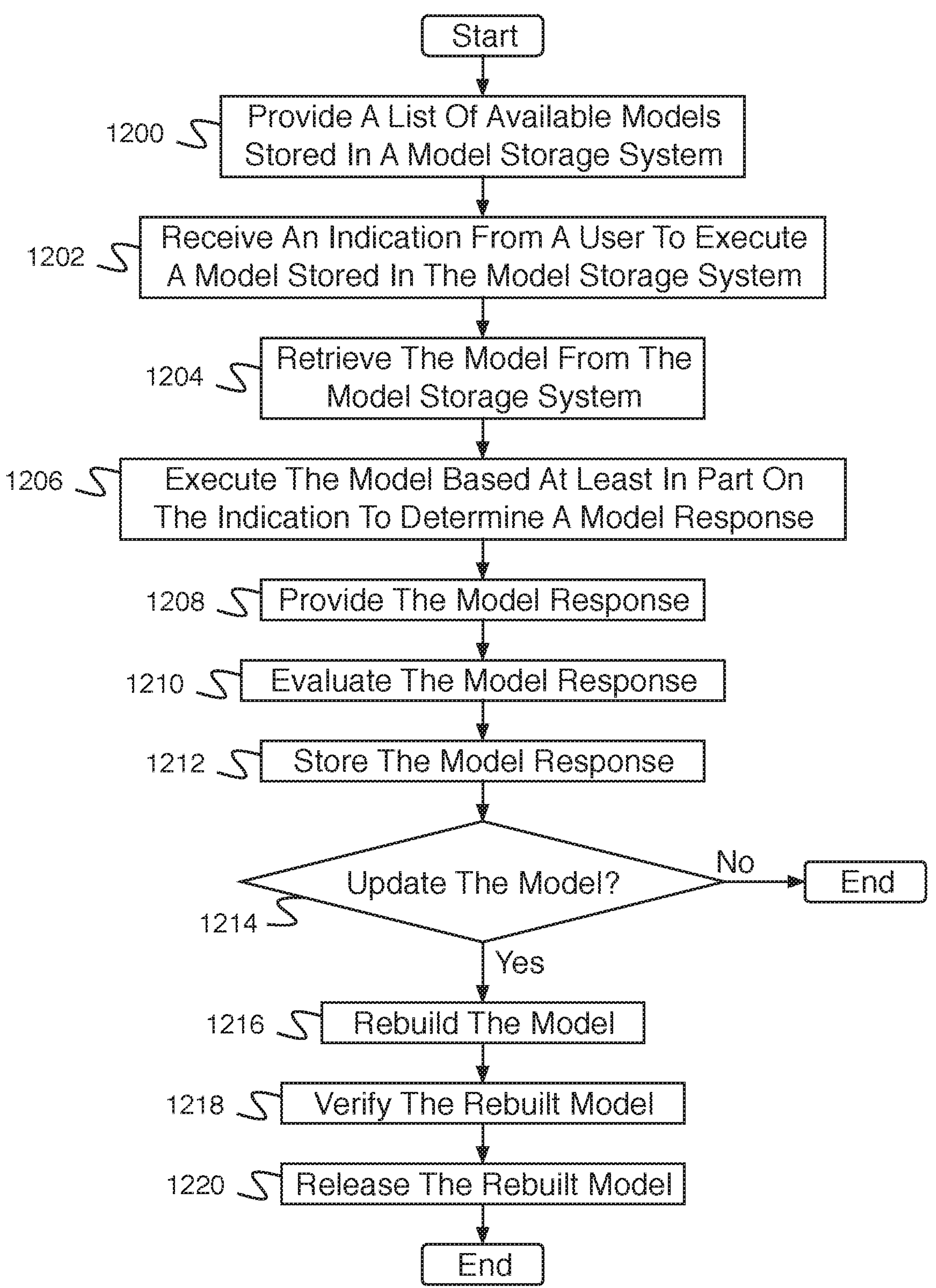
FIG. 12 is a flow diagram illustrating an embodiment of a process for running a model.

FIG. 12 is a flow diagram illustrating an embodiment of a process for running a model. In some embodiments, the process of FIG. 12 is executed by model release system 400 of FIG. 4 in interaction with a tenant user using a tenant system. In the example shown, in 1200, a list of available models is provided (e.g., to the tenant user). In 1202, an indication to execute a model stored in a model storage system is received from a user. In 1204, the model is retrieved from the model storage system. In 1206, the model is executed based at least in part on the indication to determine a model response. In 1208, the model response is provided (e.g., to the tenant user). In 1210, the model response is evaluated. In 1212, the model response is stored. In 1214, it is determined whether the model should be updated. For example, it is determined whether the model should be updated based at least in part on the quality of the model response, on an amount of time since the last time the model was updated, on a user satisfaction, etc. In the event it is determined not to update the model, the process ends. In the event it is determined to update the model, control passes to 1216. In 1216, the model is rebuilt. In 1218, the rebuilt model is verified. In 1220, the rebuilt model is released.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for automatic model training and release, comprising:
- a tenanted area of a multitenanted server system, wherein the tenanted area comprises (i) a tenanted data storage storing data only accessible to a tenant and not other tenants and (ii) a model storage system storing one or more models only accessible to the tenant and not the other tenants;
- an interface configured to:
  - receive an indication to create a model for release; and
- a processor configured to:
  - fetch data for creation of the model from the tenanted data storage, wherein the fetched data is associated with the tenant;
  - validate the fetched data to determine a data validation result;
  - extract features based at least in part on the fetched data;
  - validate the features using one or more feature quality metrics;
  - build the model based at least in part on the features and the fetched data;
  - validate the model using one or more metrics;
  - store the model in the model storage system storing the one or more models only accessible to the tenant and not the other tenants;
  - release the model for use by the tenant as a released model, wherein releasing the model comprises providing access to the released model for use by the tenant without providing access to the released model for use by the other tenants;
  - after providing access to the released model for use by the tenant, determine whether the released model fails validation based at least in part on a comparison between a second set of time series tenant data and an output of the released model executed using a first set of time series tenant data;
  - in response to a determination that the released model fails the validation, determine a number of times that the released model has failed validation and determine whether the number of times that the released model has failed validation at least meets a predetermined specific number of times, the predetermined specific number of times being greater than one; and
  - in response to a determination that the number of times that the released model has failed validation at least meets the predetermined specific number of times, remove access to the released model for use by the tenant.

2. The system of claim 1, wherein the data validation result is stored using the model storage system.

3. The system of claim 1, wherein at least some of the features are extracted using a feature extraction template.

4. The system of claim 1, wherein at least some of the features are extracted using data preprocessing.

5. The system of claim 1, wherein one or more features are dropped.

6. The system of claim 1, wherein the one or more feature quality metrics are stored using the model storage system.

7. The system of claim 1, wherein the processor is further configured to provide an indication of the data validation result.

8. The system of claim 1, wherein the data validation result comprises an indication that validating the fetched data was successful, an indication that validating the fetched data failed, or a data validation score.

9. The system of claim 1, wherein the model is built using a selected model type of a set of one or more model types.

10. The system of claim 1, wherein storing the model comprises storing the model privately for the tenant.

11. The system of claim 1, wherein the model uses data associated with the tenant.

12. The system of claim 1, wherein the model comprises a machine learning model, a supervised learning model, an unsupervised learning model, a reinforcement learning model, semi-supervised learning model, time series model, a support vector machine, or a neural network.

13. The system of claim 1, wherein the one or more metrics are stored using the model storage system.

14. The system of claim 1, wherein the processor is further configured to:

receive an indication from a user to execute a second model stored in the model storage system;

retrieve the second model from the model storage system;

execute the second model based at least in part on the indication from the user to determine a model response; and provide the model response.

15. The system of claim 1, wherein in response to a determination that the released model has not failed validation, maintain access to the released model for use by the tenant.

16. A method for automatic model training and release, comprising:

receiving an indication to create a model for release;

fetching, using a processor, data for creation of the model from a tenanted data storage storing data only accessible to a tenant and not other tenants, wherein a tenanted area of a multitenanted server system comprises the tenanted data storage, and wherein the fetched data is associated with the tenant;

validating the fetched data using to determine a data validation result;

extracting features based at least in part on the fetched data;

validating the features using one or more metrics;

building the model based at least in part on the features and the fetched data;

validating the model using one or more metrics;

storing the model in a model storage system storing one or more models only accessible to the tenant and not the other tenants, wherein the tenanted area of the multitenanted server system comprises the model storage system;

releasing the model for use by the tenant as a released model, wherein releasing the model comprises providing access to the released model for use by the tenant without providing access to the released model for use by the other tenants;

after providing access to the released model for use by the tenant, determining that the released model fails validation based at least in part on a comparison between a second set of time series tenant data and an output of the released model executed using a first set of time series tenant data;

in response to a determination that the released model fails the validation, determining a number of times that the released model has failed validation and determine whether the number of times that the released model has failed validation at least meets a predetermined specific number of times, the predetermined specific number of times being greater than one; and in response to a determination that the number of times that the released model has failed validation at least meets the predetermined specific number of times, removing access to the released model for use by the tenant.

17. The method of claim 16, further comprising:

receiving an indication from a user to execute a second model stored in the model storage system;

retrieving the second model from the model storage system;

executing the second model based at least in part on the indication from the user to determine a model response; and providing the model response.

18. The method of claim 16, wherein the model is built using a selected model type of a set of one or more model types.

19. A computer program product for automatic model training and release, the computer program product being embodied in a non-transitory computer readable storage medium and comprising computer instructions for:

receiving an indication to create a model for release;

fetching data for creation of the model from a tenanted data storage storing data only accessible to a tenant and not other tenants, wherein a tenanted area of a multitenanted server system comprises the tenanted data storage, and wherein the fetched data is associated with the tenant;

validating the fetched data to determine a data validation result;

extracting features based at least in part on the fetched data;

validating the features using one or more feature quality metrics;

building the model based at least in part on the features and the fetched data;

validating the model using one or more metrics;

storing the model in a model storage system storing one or more models only accessible to the tenant and not the other tenants, wherein the tenanted area of the multitenanted server system comprises the model storage system;

releasing the model for use by the tenant as a released model, wherein releasing the model comprises providing access to the released model for use by the tenant without providing access to the released model for use by the other tenants;

after providing access to the released model for use by the tenant, determining whether the released model fails validation based at least in part on a comparison between a second set of time series tenant data and an output of the released model executed using a first set of time series tenant data;

in response to a determination that the released model fails the validation, determining a number of times that the released model has failed validation and determine whether the number of times that the released model has failed validation at least meets a predetermined specific number of times, the predetermined specific number of times being greater than one; and in response to a determination that the number of times that the released model has failed validation at least meets the predetermined specific number of times, removing access to the released model for use by the tenant.

20. The computer program product of claim 19, further comprising computer instructions for:

receiving an indication from a user to execute a second model stored in the model storage system;

retrieving the second model from the model storage system;

executing the second model based at least in part on the indication from the user to determine a model response; and providing the model response.

* * * * *